United States Patent [19]

Fan

[11] Patent Number: 5,051,334
[45] Date of Patent: Sep. 24, 1991

[54] SOLID IMAGING METHOD USING PHOTOHARDENABLE COMPOSITIONS CONTAINING HOLLOW SPHERES

[75] Inventor: Roxy N. Fan, E. Brunswick, N.J.

[73] Assignee: E. I. Du Pont de Nemours and Company, Wilmington, Del.

[21] Appl. No.: 341,511

[22] Filed: Apr. 21, 1989

[51] Int. Cl.$^5$ .............................................. G03C 5/00
[52] U.S. Cl. .................................. 430/269; 430/270; 430/945; 522/2; 525/174; 525/162; 264/22
[58] Field of Search ............... 430/269, 945, 270; 522/2; 525/174.4, 174, 162; 264/22

[56] References Cited

U.S. PATENT DOCUMENTS

| | | | |
|---|---|---|---|
| 4,137,081 | 1/1979 | Pohl | 430/286 |
| 4,504,565 | 3/1985 | Baldvins et al. | 430/138 |
| 4,575,330 | 3/1986 | Hull | 425/174.4 |
| 4,752,498 | 6/1988 | Fudim | 427/54.1 |

FOREIGN PATENT DOCUMENTS

| | | |
|---|---|---|
| 898289 | 5/1894 | Belgium . |
| 234347 | 2/1987 | European Pat. Off. . |
| 250121 | 6/1987 | European Pat. Off. . |
| 257984 | 2/1989 | European Pat. Off. . |
| 57-013610 | 1/1982 | Japan . |
| 57-135839 | 8/1982 | Japan . |

OTHER PUBLICATIONS

Kodama, Hideo; Rev. Sci. Instrum. 52(11), 1770-1773, Nov. 1981.

Herbert, Alan J.; Journal of Applied Photographic Engineering, 8(4), 185-188, Aug. 1982.

*Primary Examiner*—Jack P. Brammer

[57] ABSTRACT

An integral three dimensional object is formed from a photohardenable liquid composition containing radiation deflecting matter which is a thermal insulator and having a different index of refraction from the liquid.

8 Claims, 3 Drawing Sheets

SOLID IMAGING METHOD USING PHOTOHARDENABLE COMPOSITIONS CONTAINING HOLLOW SPHERES

FIELD OF THE INVENTION

This invention relates to production of threedimensional objects by photohardening, and more particularly to a method utilizing photohardenable materials containing radiation deflection matter which is in the form of hollow spheres and also serves as a thermal insulator.

BACKGROUND OF THE INVENTION

Many systems for production of three-dimensional modeling by photohardening have been proposed European Patent Application No. 250,121 filed by Scitex Corp. Ltd. on June 6, 1987, provides a good summary of documents pertinent to this art area, including various approaches attributed to Hull, Kodama, and Herbert. Additional background is described in U.S. Pat. No. 4,752,498 issued to Fudim on June 21, 1988.

These approaches relate to the formation of solid sectors of three-dimensional objects in steps by sequential irradiation of areas or volumes sought to be solidified. Various masking techniques are described as well as the use of direct laser writing, i.e., exposing a photohardenable polymer with a laser beam according to a desired pattern and building a three-dimensional model layer by layer.

However, all these approaches fail to identify practical ways of utilizing the advantages of vector scanning combined with means to maintain constant exposure and attain substantially constant final thickness of all hardened portions on each layer throughout the body of the rigid three dimensional object. Furthermore, they fail to recognize very important interrelations within specific ranges of operation, which govern the process and the apparatus parameters in order to render them practical and useful. Such ranges are those of constant exposure levels dependent on the photohardening response of the material, those of minimum distance traveled by the beam at maximum acceleration dependent on the resolution and depth of photohardening, as well as those of maximum beam intensity depend on the photospeed of the photohardenable composition.

The Scitex patent, for example, suggests the use of photomasks or raster scanning for achieving uniform exposure, but does not suggest a solution for keeping the exposure constant in the case of vector scanning. The use of photomasks renders such techniques excessively time consuming and expensive. Raster scanning is also undesirable compared to vector scanning for a number of reasons, including:

necessity to scan the whole field even if the object to be produced is only a very small part of the total volume, considerably increased amount of data to be stored in most cases, overall more difficult manipulation of the stored data, and the necessity to convert CAD-based vector data to raster data.

On the other hand, in the case of vector scanning only the areas corresponding to the shape of the rigid object have to be scanned, the amount of data to be stored is smaller the data can be manipulated more easily, and "more than 90% of the CAD based machines generate and utilize vector data" (Lasers & Optronics, January 1989, Vol. 8, No. 1, pg. 56). The main reason why laser vector scanning has not been utilized extensively so far is the fact that, despite its advantages, it introduces problems related to the inertia of the optical members, such as mirrors, of the available deflection systems for the currently most convenient actinic radiation sources, such as lasers. Since these systems are electromechanical in nature, there is a finite acceleration involved in reaching any beam velocity. This unavoidable nonuniformity in velocity results in unacceptable thickness variations. Especially in the case of portions of layers having no immediate previous levels of exposure at the high intensity it becomes necessary to use high beam velocities, and therefore, longer acceleration times, which in turn result in thickness nonuniformity. The use of low intensity lasers does not provide a good solution since it makes production of a solid object excessively time consuming. In addition, the usefulness of vector scanning is further minimized unless at least the aforementioned depth and exposure level relationships are observed as evidenced under the Detailed Description of this invention.

No special attention has been paid so far to the composition itself by related art in the field of solid imaging, except in very general terms.

Thus, the compositions usually employed, present a number of different problems. Such problems are:

excessive photohardening depthwise usually accompanied by inadequate photohardening widthwise. This problem becomes especially severe in cantilevered or other areas of the rigid object, which areas are not immediately over a substrate;

loss in photospeed, due to local loss of the polymerization heat during photohardening;

loss in resolution due to diffusion of heat away from the locus of photohardening;

decreased shelf stability, due to differences in specific gravity between the radiation deflecting matter and the rest of the photohardenable composition.

Therefore, it is an object of this invention to resolve the problems cited above by:

incorporating radiation deflecting matter in the photohardenable composition of highly different index of refraction in order to limit the depth of photohardening with simultaneous increase of the width of photohardening, so that the resolution is better balanced in all directions;

using radiation deflection matter which has thermally insulating properties in order to improve the photospeed and resolution;

using radiation deflecting matter which has comparable specific gravity as the rest of the photohardenable composition, in order to improve shelf stability.

European Patent Application 250,121 (Scitex Corp., Ltd.) discloses a three dimensional modelling apparatus using a solidifiable liquid which includes radiation transparent particles in order to reduce shrinkage.

U.S. Pat. No. 4,504,565 (Baldvins et al.) describes a radiation imageable composition in which an image can be produced upon exposure to intense radiation, the composition comprising (a) hollow ceramic microspheres, and (b) a binder material which will not be destroyed during exposure of the composition to intense radiation and will not mask the image produced upon exposure to intense radiation.

SUMMARY OF THE INVENTION

The instant invention is directed to methods for direct production of three-dimensional photohardened solid objects, layer by layer using actinic radiation, preferably in a beam form such as provided by lasers for direct writing, by utilizing photohardenable compositions, which contain radiation deflection matter in order to limit the depth of photohardening with simultaneous increase of the width of photohardening, so that the resolution is better balanced in all directions. The integrity of the integral three dimensional objects or parts thus formed is also highly improved. The radiation deflecting matter being in the form of hollow spheres, has also thermal insulation properties, and it preferably possesses a specific gravity which is comparable to that of the rest of the photohardenable composition.

This invention may be summarized as follows:

A method for accurately fabricating an integral three dimensional object from successive layers of a photohardenable liquid composition comprising the steps of:

(a) forming a layer of a photohardenable liquid;
(b) photohardening at least a portion of the layer of photohardenable liquid by exposure to actinic radiation;
(c) introducing a new layer of photohardenable liquid onto the layer previously exposed to actinic radiation;
(d) photohardening at least a portion of the new liquid layer by exposure to actinic radiation, with the requirement that the photohardenable composition comprises an ethylenically unsaturated monomer, a photoinitiator, and radiation deflecting matter, the deflecting matter being in the form of hollow spheres acting as a thermal insulator and having a first index of refraction, the rest of the composition having a second index of refraction, the absolute value of the difference between the first index of refraction and the second index of refraction being different than zero; and
(e) successively repeating steps (c) and (d) until the three dimensional object is complete.

BRIEF DESCRIPTION OF THE DRAWING

The reader's understanding of practical implementation of preferred embodiments of the invention will be enhanced by reference to the following detailed description taken in conjunction with perusal of the drawing figure, wherein.

DETAILED DESCRIPTION OF THE INVENTION

The instant invention is directed to methods for direct production of three-dimensional photohardened solid objects, layer by layer using actinic radiation, preferably in a beam form such as provided by lasers for direct writing, by using photohardenable compositions comprising an ethylenically unsaturated monomer, a photoinitiator, and radiation deflecting matter, the deflecting matter being a thermal insulator and having a first index of refraction, and the rest of the composition having a second index of refraction, the absolute value of the difference between the first index of refraction and the second index of refraction being different than zero.

As aforementioned, many systems for production of three-dimensional modeling by photohardening have been proposed. European Patent Application No. 250,121 filed by Scitex Corp. Ltd. on June 6, 1987, provides a good summary of documents pertinent to this art area, including various approaches attributed to Hull, Kodama, and Herbert. Additional background is described in U.S. Pat. No. 4,752,498 issued to Fudim on June 21, 1988.

Figure 1:
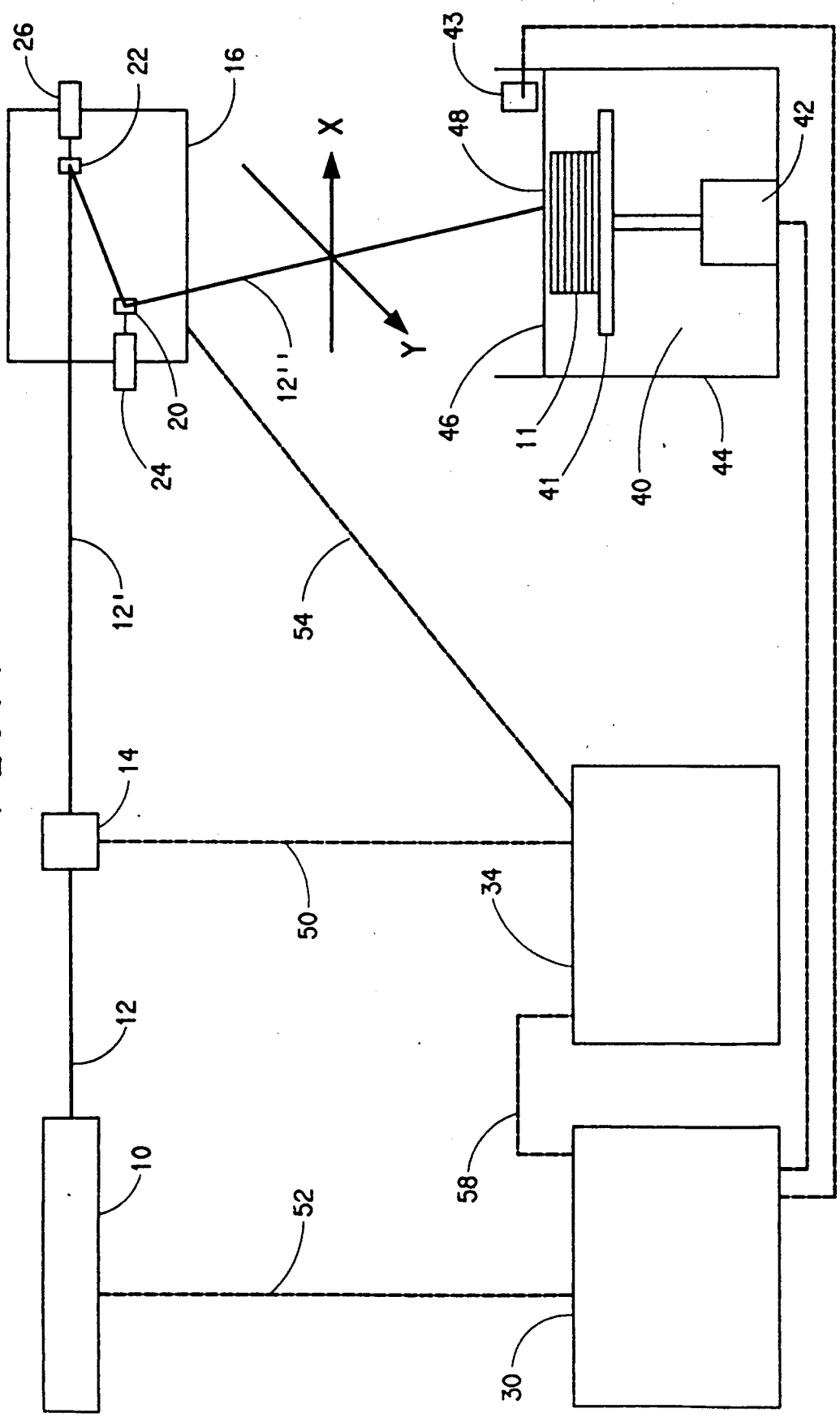
FIG. 1 is a block diagram of an apparatus used to perform the preferred embodiment of the process of the instant invention.

In a preferred embodiment, an apparatus for practicing the present invention is depicted in FIG. 1, in the form of a block diagram. The apparatus and its operation are described below.

Actinic radiation means 10 shown in FIG. 1, which is preferably a high power laser, is used to provide an actinic radiation beam 12 having a certain intensity. The radiation beam 12 is passed through a modulator 14, where its intensity may be modulated. The modulated beam 12' is passed in turn through deflection means 16 such as a vector scanner in the form of a two-mirror 20 and 22 assembly, each mirror separately driven by a different motor 24 and 26 respectively. By causing mirror 20 driven by motor 24 to turn, the beam is deflected in an X direction, while by causing mirror 22 to turn, the beam is deflected in a Y direction, X direction being perpendicular to the Y direction. The actinic radiation beam 12" is thus controllably deflected towards preselected portions of the photohardenable composition which is contained in vessel 44 and presents a surface 46. It photohardens a thin layer 48 closest to the surface 46 of a photohardenable composition 40, to a depth of photohardening which equals the maximum thickness of the layer 48. The composite movement of the beam is preferably a vector type movement, and the beam is said to move or be scanned in a vector mode. Due to the inertia of the electromechanical deflection means 16, the velocity of the beam 12" on the thin layer 48 is also limited by the inertia and the electromechanical nature of the deflection means 16.

The deflection of the two mirrors 20 and 22 through motors 24 and 26 respectively is controlled by the second computer control means 34, while the graphic data corresponding to the shape of the solid object under production are stored in the first computer control means 30.

The second computer control means 34 is coupled with the modulation means 14, the deflection means 16, and the first computer control means 30, through control/feedback lines 50, 54, and 58, respectively. The graphic data stored in computer control means 30 are fed to computer control means 34, and after being processed cause motors 24 and 26 to turn and move mirrors 20 and 22 accordingly in order to deflect the beam towards predetermined positions on the thin layer 48. Electrical feedback regarding the relative movements of the mirrors 20 and 22 is provided by the deflection means to the second computer control means 34 through line 54.

The manner of introducing successive layers of photohardenable liquid and exposing to actinic radiation such as a laser will generally be by two methods. In a first method a pool of liquid is present in a vessel and it is not necessary to introduce additional photohardenable liquid. In such case a movable table or floor supports the liquid. Initially the table or floor is elevated with a portion of the photohardenable liquid present above the table or floor and a portion of the liquid present in the vessel around the edge of the table or floor and/or underneath it. (Illustratively a table is present which allows liquid to flow underneath the table as it is used.) After exposure and photohardening of a portion of the liquid layer above the table, the table is lowered to allow another layer of photohardenable liquid to flow on top of the previous layer followed by exposure of predetermined area on the newly applied liquid layer. If necessary due to the shape of the final three dimensional article the thickness of more than one liquid layer can be photohardened. This procedure of table or floor lowering and exposure continues until formation of the desired three dimensional article occurs.

In a second method a movable table or floor need not be employed but rather a new quantity of photohardenable liquid is introduced into a vessel after an exposure step in formation of a new liquid layer on a previously exposed layer containing both photohardened liquid and photohardenable material. Criticality is not present in the manner of liquid introduction but rather in an ability to photoharden successive liquid layers.

In FIG. 1, a movable table 41 is initially positioned within the photohardenable composition 40, a short predetermined distance from the surface 46, providing a thin layer 48 between the surface 46 and the table 41. The positioning of the table is provided by the placement means 42, which in turn is controlled by the first computer control means 30 according to the data stored therein. The graphic data corresponding to the first layer of the shape of the rigid object are fed from computer control means 30 to computer control means 34, where they are processed along with feedback data obtained from deflecting means 16, and are fed to modulator 14 for controlling the same, so that when the beam travels in a vector mode on predetermined portions of the thin layer 48, the exposure remains constant.

When the first layer of the rigid object is complete, the movable table 41 is lowered by a small predetermined distance by the placement means 42 through a command from first computer control means 30. Following a similar command from computer means 30, layer forming means, such as doctor knife 43 sweeps the surface 46 for leveling purposes. The same procedure is then followed for producing the second, third, and the following layers until the rigid object is completed.

In the discussions above and below, the actinic radiation, preferably in the form of a beam, and more preferably in the form of a laser beam, is many times referred to as light, or it is given other connotations. This is done to make the discussion clearer in view of the particular example being described. Thus, it should not be taken as restricting the scope and limits of this invention. Nevertheless, the preferred actinic radiation is light, including ultraviolet (UV), visible, and infrared (IR) light. From these three wavelength regions of light, ultraviolet is even more preferred.

The formulation of the photohardenable compositions for solid imaging purposes is very important in order to receive the desirable effects and characteristics, regardless of whether the scanning is of the vector type, raster type, or any other type, and the discussion hereinafter is referred to in any type of scanning, unless otherwise stated. However, from the different types of scanning, the vector type is the preferred type of scanning.

A photohardenable composition for solid imaging should contain at least one photohardenable monomer or oligomer and at least one photoinitiator. For the purposes of this invention, the words monomer and oligomer have substantially the same meaning and they may be used interchangeably.

Examples of suitable monomers which can be used alone or in combination with other monomers include t-butyl acrylate and methacrylate, 1,5-pentanediol diacrylate and dimethacrylate, N,N-diethylaminoethyl acrylate and methacrylate, ethylene glycol diacrylate and dimethacrylate, 1,4-butanediol diacrylate and dimethacrylate, diethylene glycol diacrylate and dimethacrylate, hexamethylene glycol diacrylate and dimethacrylate, 1,3-propanediol diacrylate and dimethacrylate, decamethylene glycol diacrylate and dimethacrylate, 1,4-cyclohexanediol diacrylate and dimethacrylate, 2,2-dimethylolpropane diacrylate and dimethacrylate, glycerol diacrylate and dimethacrylate, tripropylene glycol diacrylate and dimethacrylate, glycerol triacrylate and trimethacrylate, trimethylolpropane triacrylate and trimethacrylate, pentaerythritol triacrylate and trimethacrylate, polyoxyethylated trimethylolpropane triacrylate and trimethacrylate and similar compounds as disclosed in U.S. Pat. No. 3,380,831, 2,2-di(p-hydroxyphenyl)-propane diacrylate, pentaerythritol tetraacrylate and tetramethacrylate, 2,2-di-(p-hydroxyphenyl)-propane dimethacrylate, triethylene glycol diacrylate, polyoxyethyl-2,2-di(phydroxyphenyl)propane dimethacrylate, di-(3-methacryloxy-2-hydroxypropyl) ether of bisphenol-A, di-(2-methacryloxyethyl) ether of bisphenol-A, di-(3-acryloxy-2-hydroxypropyl) ether of bisphenol-A, di-(2-acryloxyethyl) ether of bisphenol-A, di-(3-methacryloxy-2-hydroxypropyl) ether of 1,4-butanediol, triethylene glycol dimethacrylate, polyoxypropyltrimethylol propane triacrylate, butylene glycol diacrylate and dimethacrylate, 1,2,4-butanetriol triacrylate and trimethacrylate, 2,2,4-trimethyl-1,3-pentanediol diacrylate and dimethacrylate, 1-phenyl ethylene-1,2-dimethacrylate, diallyl fumarate, styrene, 1,4-benzenediol dimethacrylate, 1,4-diisopropenyl benzene, and 1,3,5-triisopropenyl benzene. Also useful are ethylenically unsaturated compounds having a molecular weight of at least 300, e.g., alkylene or a polyalkylene glycol diacrylate prepared from an alkylene glycol of 2 to 15 carbons or a polyalkylene ether glycol of 1 to 10 ether linkages, and those disclosed in U.S. Pat. No. 2,927,022, e.g., those having a plurality of addition polymerizable ethylenic linkages particularly when present as terminal linkages. Particularly preferred monomers are ethoxylated trimethylolpropane triacrylate, ethylated pentaerythritol triacrylate, dipentaerythritol monohydroxypentaacrylate 1,10-dimethacrylate, decanediol dimethylacrylate, di-(3-acryloxy-2-hydroxylpropyl)ether of bisphenol A oligomers, di-(3-methacryloxy-2-hydroxyl alkyl)ether of bisphenol A oligomers, urethane diacrylates and methacrylates and oligomers thereof, coprolactone acrylates and methacrylates, propoxylated neopentyl glycol diacrylate and methacrylate, and mixtures thereof.

Examples of photoinitiators which are useful in the present invention alone or in combination are described in U.S. Pat. No. 2,760,863 and include vicinal ketaldonyl alcohols such as benzoin, pivaloin, acyloin ethers, e.g., benzoin methyl and ethyl ethers, benzil dimethyl ketal; α-hydrocarbon-substituted aromatic acyloins, including α-methylbenzoin α-allylbenzoin, α-phenylbenzoin, 1-hydroxylcyclohexyl phenol ketone, diethoxyphenol acetophenone, 2-methyl-1-[4-(methylthio)-phenyl]-2-morpholino-propanone-1. Photoreducible dyes and reducing agents disclosed in U.S. Pat. Nos. 2,850,445, 2,875,047, 3,097,096, 3,074,974, 3,097,097 and 3,145,104, as well as dyes of the phenazine, oxazine, and quinone classes, Michler's ketone, benzophenone, acryloxy benzophenone, 2,4,5-triphenylimidazolyl dimers with hydrogen donors including leuco dyes and mixtures thereof as described in U.S. Pat. Nos. 3,427,161, 3,479,185 and 3,549,367 can be used as initiators. Also useful with photoinitiators are sensitizers disclosed in U.S. Pat No. 4,162,162. The photoinitiator or photoinitiator system is present in 0.05 to 10% by weight based on the total weight of the photohardenable composition. Other suitable photoinitiation systems which are thermally inactive but which generate free radicals upon exposure to actinic light at or below 185° C. include the substituted or unsubstituted polynuclear quinones which are compounds having two intracyclic carbon atoms in a conjugated carbocyclic ring system, e.g., 9,10-anthraquinone, 2-methylanthraquinone, 2-ethylanthraquinone, 2-tert-butylanthraquinone, octamethylanthraquinone, 1,4-naphthoquinone, 9,10-phenanthraquinone, benz(a)anthracene-7,12-dione, 2,3-naphthacene-5,12-dione, 2-methyl-1,4-naphthoquinone, 1,4-dimethyl-anthraquinone, 2,3-dimethylanthraquinone, 2-phenylanthraquinone, 2,3-diphenylanthraquinone, retenequinone, 7,8,9,10-tetrahydronaphthacene-5,12-dione, and 1,2,3,4-tetrahydrobenz(a)anthracene-7,12-dione; also, alpha amino aromatic ketones, halogenated compounds like Trichloromethyl substituted cyclohexadienones and triazines or chlorinated acetophenone derivatives, thioxanthones in presence of tertiary amines, and titanocenes.

Although the preferred mechanism of photohardening is free radical polymerization, other mechanisms of photohardening apply also within the realm of this invention. Such other mechanisms include but are not limited to cationic polymerization, anionic polymerization, condensation polymerization, addition polymerization, and the like.

Other components may also be present in the photohardenable compositions, e.g., pigments, dyes, extenders, thermal inhibitors, interlayer and generally interfacial adhesion promoters, such as organosilane coupling agents, dispersants, surfactants, plasticizers, coating aids such as polyethylene oxides, etc. so long as the photohardenable compositions retain their essential properties.

In this discussion a clear distinction should be made between a photohardenable and a photohardened composition. The former refers to one which has not yet been subjected to irradiation, while the latter refers to one which has been photohardened by irradiation.

When the composition is clear to the radiation beam, the depth of photohardening is considerably larger than the width of photohardening, mainly because the beams utilized, such as laser beams, and the like, are well collimated and focused. Addition of inert particulate matter, which is transparent to the radiation in the environment of the composition, has certain well recognized advantages, such as reduction of shrinkage upon polymerization or photohardening in general, and often increase in photospeed due to the reduction of the amount of active composition, which is subject to shrinkage, per unit of volume.

The large depth of photohardening is not a very big problem in areas supported by a substrate, since the depth is determined primarily by the thickness of the liquid layer on top of the substrate. However, in cantilevered unsupported areas, where the thickness of the liquid is very large, it becomes a serious disadvantage, as the depth of photohardening is not controlled or limited any more by the substrate. This is actually the area where the differences between conventional two dimensional imaging and solid or three dimensional imaging manifest themselves as being most profound. This is particularly important when there are uncontrollable exposure variations, which may result in thickness variations, and poor resolution. Thus a way to control the thickness is needed.

In addition to the lack of control of the depth of photohardening, there is one more problem having to do with resolution considerations. Except in very limited occasions, it is highly desirable for the resolution or tolerances of a part to be comparable in all dimensions. It does not make much sense to have high resolution in one dimension and very poor resolution in another dimension since the final resolution is going to be necessarily considered as poor, except in rare occasions as mentioned above. In clear compositions, the depth to width ratio is high, and thus the resolution widthwise is accordingly higher than the resolution depthwise. As a matter of fact, the resolution is inversely proportional to the dimensional units, and therefore, if the depth to width ratio is for example 5, the width resolution will be five times better than the depth resolution, when other factors do not play an active role. Thus, high transparency of the composition becomes in general undesirable. Preferable regions of depth to width ratios are 7:1 to 1:1, and more preferable 3:1 to 1:1.

The task of reducing the transparency or in other words increasing the optical density, also referred to as opacity, of the photohardenable composition sounds as a rather straightforward one, and it is, if photospeed and other important parameters are not taken into account. For example, addition of a radiation absorbent in the composition will decrease the depth of photohardening without affecting considerably the width. Typical absorbents are dyes. The monomers or oligomers of the composition may also act as absorbants to different degrees. However, if a dye, or other absorbent is used, the part of the radiation which is absorbed by it will not be available to directly promote photohardening.

Considering now the photoinitiator as means of absorption to reduce the depth of photohardening, it should be realized that in order for this to happen a certain high content in photoinitiator has to be exceeded. As the content in photoinitiator in the composition increases from zero incrementally, the photospeed increases but at the same time the depth also increases since low starving areas at the bottom of the depth of photohardening form now more polymer due to the increase in number of free radicals. Only when the radiation starts being intercepted to a considerable degree by an excessive amount of photoinitiator, will the depth of photohardening start decreasing. However, the properties of the photohardened object will start deteriorating. This is because as the concentration of free radicals being formed increases the molecular weight decreases, and therefore the structural properties deteriorate. At the same time, in the plethora of free radicals, the free radicals may start combining with each other and just absorb energy without fulfilling their role of photoinitiation. Thus, although the amount of photoinitiator can in a limited way serve as means for controlling the depth of photohardening, other undesirable phenomena occurring simultaneously, decrease considerably its usefulness when employed only by itself for this purpose.

As part of this invention, a separate phase of dispersed particulate solid matter may be utilized to control the depth/width relation, under certain conditions, which involve refraction or reflection or scattering of light or any combination thereof, labelled as radiation deflection for the purposes of this discussion. If everything else is kept constant, as the content in separate phase of radiation deflecting matter is increased, so does the width in expense of the depth. Since the radiation is not absorbed but just deflected, no considerable loss of radiation occurs, and therefore, there is no substantial loss of photospeed. Thus, the radiation deflecting matter which may be utilized in the preferred embodiments of this invention is substantially non-transparent in the environment of the photohardenable composition, since it gives opacity to the same.

It is essential to note that the phenomena of transparency, and non-transparency (translucence, opacity, absorbance) are only important when examined in the environment and conditions within the limits of which they occur. A powder for example dispersed in a medium, is transparent to radiation if not only it does not absorb inherently the radiation, but also if it has substantially the same index of refraction as the medium so that no light deflection takes place at or around the interface of each particle of the powder and the medium. The same powder, when dispersed in a liquid of substantially different refraction index, it will appear as translucent or opaque (hindering at least part of the light to travel directly through the medium containing the powder); in other words it will appear as non-transparent. Thus, translucence and opacity may have similar end results as absorbance regarding amount of light passing through.

The amount of light-deflecting matter to give optimum properties to the photohardenable composition is a function of a number of factors, as shown below, as well as of the balance of gains and compromises that constitute what is considered to be "optimum" at the time, depending on the particular circumstances. Thus, it would not be appropriate to attempt to give absolute numbers in order to show how one can achieve optimum properties. It would rather be much more accurate to show the interrelationships governing these factors, in order to allow a person skilled in the art to practice this invention and select a set of properties that he or she would consider optimum for the desired result. It is preferable that there is an adequate amount of radiation deflecting matter in the composition to reduce the depth of photohardening by at least 10%, more preferably at least by 20%, and even more preferably at least by 40%. It is also preferable that the depth to width ratio does not increase by such addition. In any case, the amount of light deflecting matter may be from 5% to 70% by weight, depending on the degree of deflection that it may provide. In less extreme cases with regard to both particle size and refraction index, it would be preferable for the amount of the deflecting matter in the composition to range within 10% and 60%, and most preferable within 20% and 45% by weight. As mentioned before, matter such as radiation deflecting matter is desirable also for reducing shrinkages and increasing photospeed.

Initially, if we call "particle" each individual unit of the separate phase of the dispersed matter in the photohardenable composition as aforementioned, the maximum particle size, measured as the average particle diameter, should be smaller than the depth of photohardening, but not width necessarily. It is preferred that not only substantially all particles are smaller than the depth of photohardening, but also that at least 90% of the particles are smaller than half the depth of photohardening, and even more preferred that at least 90% of the particles are smaller than one tenth the depth of photohardening.

In order to be effective for their purpose, the majority of particles should also be preferably larger than approximately half the wavelength of the beam's radiation. At approximately half the wavelength, the scattering yield of the particles attains a maximum value, while it decreases rapidly as the size of the particles goes down. On the other hand, as the particle size increases over about half the wavelength of the radiation, the scattering yield also starts dropping, but at a lower pace. As the particle size increases even more, the phenomena of refraction and reflection start prevailing. In practice there are only limited situations where all particles have substantially the same size, in which case they are called monodisperse. Generally, there is a distribution of particle sizes providing a combination of all types of actinic-radiation deflection. Taking into account also that the higher the refractive index of the particle the higher the scattering, one can practically achieve any desired opacity, by lowering or raising the content in deflecting matter, which in turn will control the depth of photohardening. The separate phase of the deflection matter should have a different refraction index than that of the rest of the photohardenable composition. The two refraction indices should preferably be differing by at least 0.01, more preferably by at least 0.02, and even more preferably by at least 0.04.

It is also preferable that the refraction index of the phase of the deflection matter is higher than that of the photohardenable composition, as long as it falls within the above limitations.

Reduction of the depth of photohardening to a desired level takes place with:
  increased difference between the refractive index of the composition containing no radiation deflecting matter and the deflecting matter itself;
  increased content in radiation deflecting matter; decrease in particle size;
  increased difference in refractive index due to the result of actinic radiation.

The instant invention utilizes compositions, where the deflecting matter is selected such that it is not only fulfilling the purpose of deflecting the radiation, having a refraction index considerably different than that of the rest of the photohardenable composition, but also is a thermal insulator. This is desirable because the heat released during the photohardening process is contained within the region under polymerization and increases the photospeed and the resolution at the same time. Actually, any separate phase of deflecting matter having lower thermal conductivity than the rest of the photohardenable composition will tend to serve this purpose. However, it is preferable that the thermal conductivity of the deflecting matter is less than one half, and more preferably less than one quarter that of the rest of the photohardenable composition. Such conditions are easily met by using capsules of gas in the form of hollow spheres, such as glass, ceramic, and carbon hollow spheres, polymer hollow spheres and the like. Hollow spheres are preferable than solid particles, not only because of their considerably lower thermal conductivity, but also because they provide higher radiation deflection power. A description of hollow beads is given in chapter 19 of "Handbook of Fillers and Reinforcements for Plastics", Edited by H. S. Katz and J. V. Milewski, Van Nostrand Reinhold Co., 1978.

Complete absence of inert matter in the composition may cause excessive thermal insulation resulting in boiling of the ingredients of the composition, especially at higher levels of exposure. Hollow spheres provide adequate heat capacity to dissipate the excessive heat of photohardening, but still provide thermal insulation to increase the photospeed. These effects can be illustrated by comparing the shape distortion of the sample described in Example 7, which contains no separate matter to dissipate the excessive heat of polymerization, versus the undistorted and uniform samples of Examples 2, 3A to 3C, 4A and 4B which contain the hollow glass microspheres; also, by comparing the unexpected photospeed difference between the sample of Example 4A and the sample of Example 4B microspheres where the sample with the hollow microspheres is considerably improved regarding photospeed.

Hollow spheres provide also an additional advantage of having specific gravities which resemble more closely to the organic ingredients of the photohardenable compositions. It is preferable that the specific gravity of the hollow spheres is within ±20% of the specific gravity of the rest of the photohardenable composition, and more preferably within ±10%. This is very well demonstrated by comparing the results of Example 5 to the results of Example 6. In the case of the hollow spheres, only mild settling occurred in one week, while in the case of solid microspheres, hard settling occurred only in one day. Surface treatment on the spheres, such as silane treatment, is also very beneficial regarding the stability of the dispersion.

Figure 2:
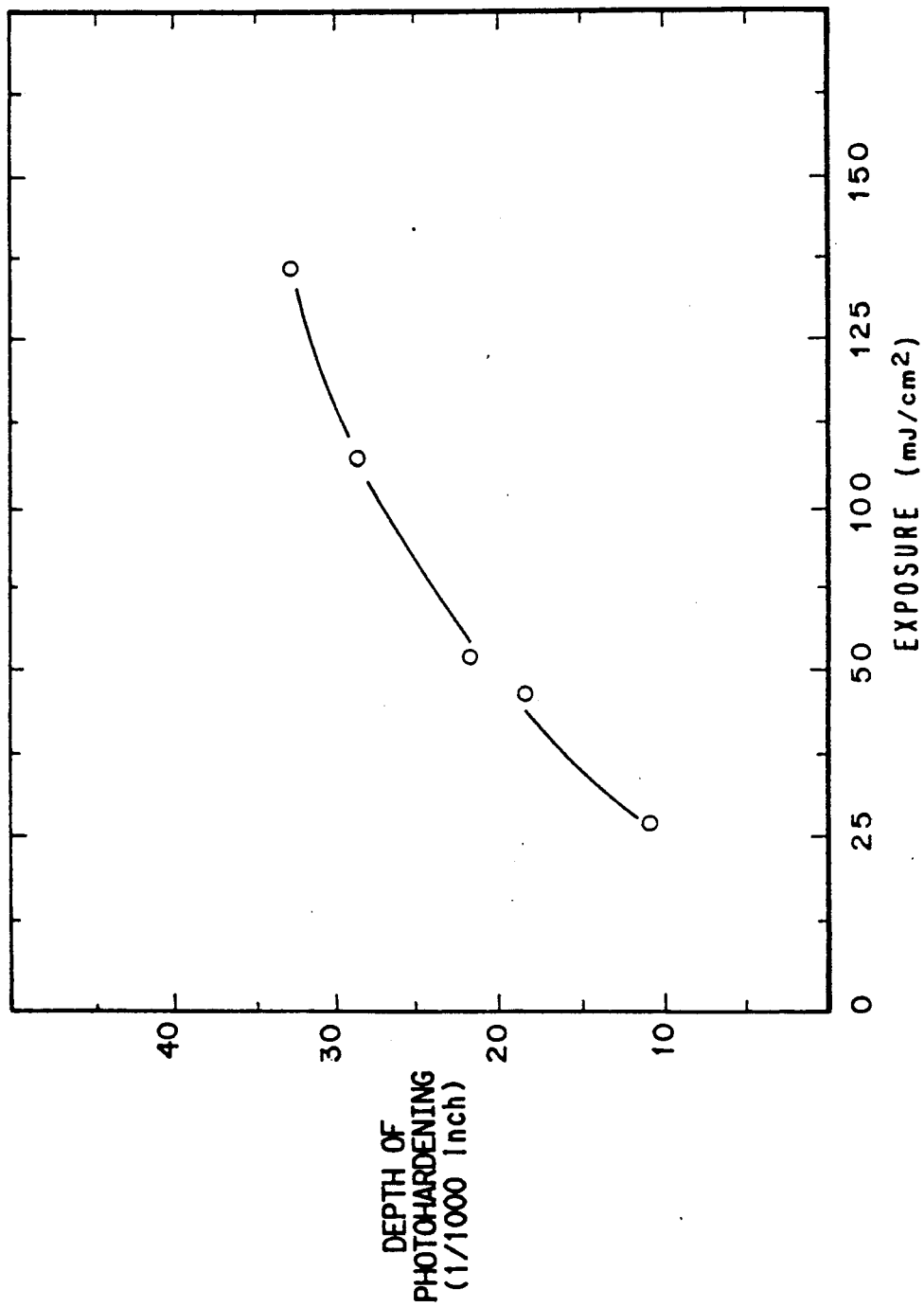
FIG. 2 shows a typical relationship between depth of photohardening and exposure in the case of a photohardenable composition containing no hollow
Figure 3:
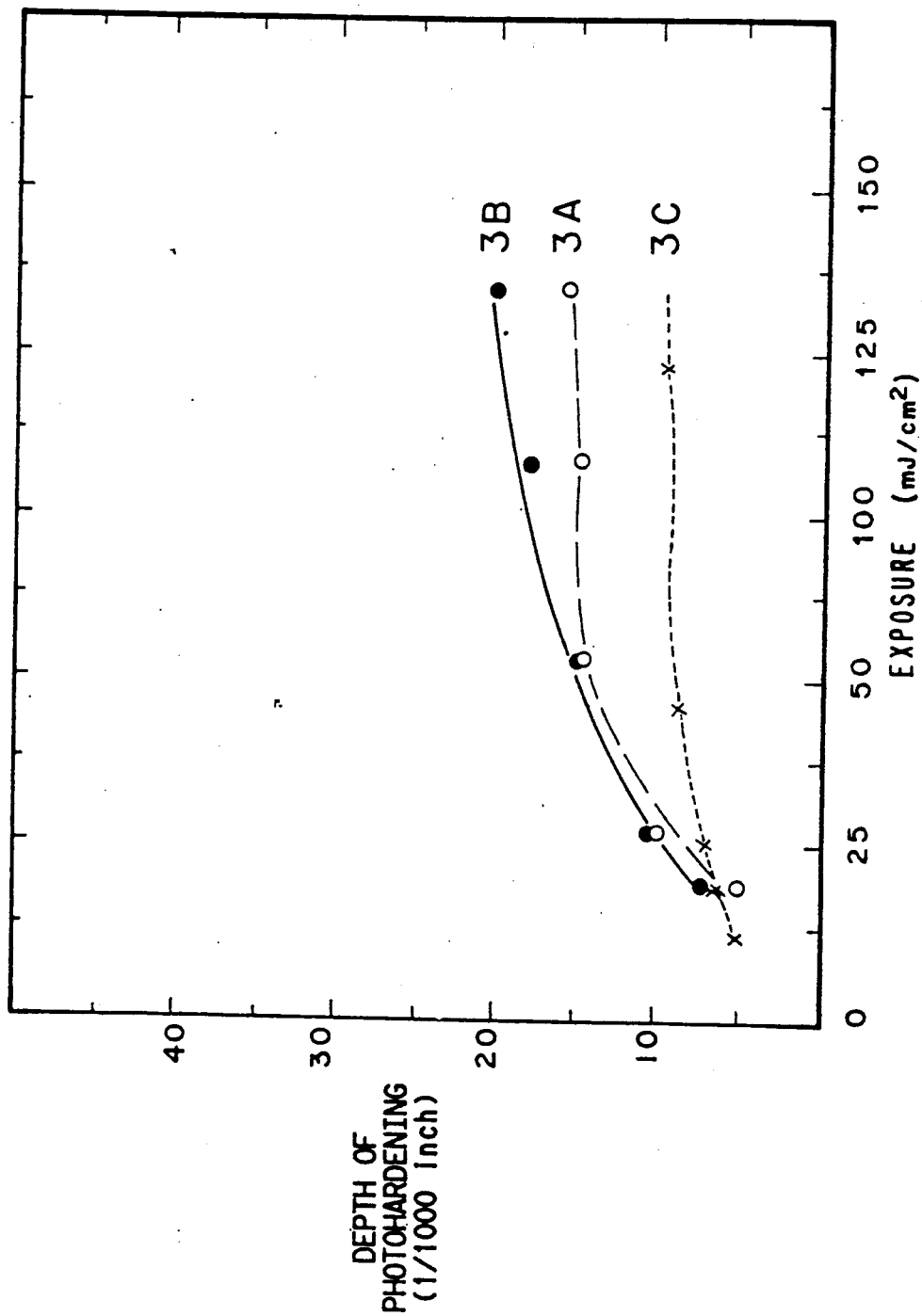
FIG. 3 shows a typical relationship between depth of photohardening and exposure in the case of a photohardenable composition containing hollow glass spheres as radiation deflecting matter.

FIG. 3, corresponding to the samples obtained in Examples 3A to 3B, show the effect of hollow glass spheres on the depth of photohardening. As the exposure increases, the depth is approaching a plateau much faster than in the case of the composition shown in FIG. 2, corresponding to the sample of Example 2. Example 7 would give a straight line without a plateau; which indicates no self limiting characteristics regarding depth of photohardening.

Examples of photohardenable compositions are given below for illustration purposes only, and should not be construed as restricting the scope or limits of this invention.

EXAMPLE 1

(Sample preparation)

The samples described in the Examples 2 and 3 below, were prepared as follows:

The photohardenable composition was poured into a stainless steel square cavity (1¾"×1¾"×110 mils thick). The excess liquid was removed by a doctor knife blade. The liquid was exposed with a rectangular pattern (1 9/16"+1½") using an argon ion laser beam as described above.

After exposure, the solidified pattern was removed from the cavity with a pair of tweezers, and then blotted dry. The net weight and thickness of the pattern were measured and plotted against different exposure levels. Other pertinent observations were also made.

EXAMPLE 2

The following ingredients were mixed with a mechanical mixer until a homogeneous mixture was received:

| | |
|---|---|
| Novacure 3704 (Bisphenol A bis(2-hydroxypropyl) diacrylate | 70.0 |
| Plasthall 4141 (Triethylene glycol caprate - caprylate) | 30.0 |
| Irgacure 651 (2,2-dimethoxy-2 phenylacetophenone) | 1.6 |

A sample was made as described in Example 1. The relation of depth of photohardening versus exposure is shown in FIG. 2. The unexposed composition was clear and it became slightly opaque upon exposure.

EXAMPLES 3A to 3C

The following ingredients were mixed with a mechanical mixer until a homogeneous mixture was received:

| | A | B | C |
|---|---|---|---|
| Novacure 3704 (Bisphenol A bis(2-hydroxypropyl) diacrylate | 56 | 63 | 24 |
| Plasthall 4141 (Triethylene glycol caprate - caprylate) | 24 | 27 | 12 |
| TMPTA (Trimethylol Propane Triacrylate) | — | — | 24 |
| Triton X-100 (Octyl phenol poly ether alcohol) | 0.2 | 0.2 | 0.78 |
| Irgacure 651 (2,2-dimethoxy-2 phenylacetophenone) | 1.6 | 1.6 | 1.6 |
| Hollow glass spheres (Sphericel B110 P8, Density 1.1, by Potters Industries, Inc.) | 20 | 10 | 40 |

Samples were made as described in Example 1. The relation of depth of photohardening versus exposure is shown in FIG. 3.

All samples were substantially undistorted. They were opaque before and after photohardening.

EXAMPLE 4A AND 4B

The following ingredients were mixed with a mechanical mixer until a homogeneous mixture was received:

| | A | B |
|---|---|---|
| Novacure 3704 (Bisphenol A bis(2-hydroxypropyl) diacrylate | 30 | 30 |
| Plasthall 4141 (Triethylene glycol caprate - caprylate) | 15 | 15 |
| TMPTA (Trimethylol Propane Triacrylate1) | 30 | 30 |
| Triton X-100 (Octyl phenol poly ether alcohol) | 0.8 | 0.8 |
| Irgacure 651 (2,2-dimethoxy-2 phenylacetophenone) | 2.0 | 2.0 |
| Hollow glass spheres (Sphericel B110 P8, Density 1.1, by Potters Industries, Inc.) | 40 | — |
| Solid glass spheres (E-5,000, by Potters Industries, | — | 50 |

| | A | B |
|---|---|---|
| Inc.) | | |

Thick liquid films (110 mils) of compositions 4A and 4B were covered by a polyproplyene coversheet and a square root step wedge was placed on top. Upon exposure with a mercury lamp (2 kw for 23 seconds, in a Du Pont Riston ® Printer 24) it was found that an integral solid film had been formed through the 9th step in the case of composition 4A, while in the case of composition 4B, an integral film had been formed only through the 6th step.

EXAMPLE 5

The composition of Example 4A was placed in a glass jar and was examined periodically for settling characteristics. It was found that in one week, light separation had occurred towards both the bottom and the top of the jar, while a considerable amount of microspheres had remained in suspension, judging from the turbid appearance of the composition. Mild stirring of the composition was adequate to reestablish the uniformity of the dispersion.

EXAMPLE 6

The composition of Example 5A was placed in a similar glass jar as described in Example 5, and was examined periodically for settling characteristics. It was found that hard settling occurred only in one day, requiring vigorous stirring of the composition in order to re-establish the uniformity of the dispersion.

EXAMPLE 7

The following ingredients were mixed with a mechanical stirrer until a homogeneous mixture was received:

| | |
|---|---|
| TMPTA (Trimethylol Propane Triacrylate) | 100 |
| Irgacure 651 (2,2-dimethoxy-2-phenylacetophenone) | 0.4 |

A sample of this composition was evaluated as in the case of Examples 4A and 4B. It was found that an integral solid film had been formed through the 3rd step. The solid film was severely deformed and the polypropylene coversheet melted.

EXAMPLE 8

The following ingredients were mixed with a mechanical stirrer until a homogeneous mixture was received:

| | |
|---|---|
| Novacure 3704 (Bisphenol A bis(2-hydroxypropyl) diacrylate | 30 |
| TMPTA (Trimethylol Propane Triacrylate) | 30 |
| Plasthall 4141 (Triethylene glycol caprate - caprylate) | 15 |
| Triton X-100 (Octyl phenol poly ether alcohol) | 0.8 |
| Irgacure 651 (2,2-dimethoxy-2 phenylacetophenone) | 2.0 |
| UCAR ® Phenolic Microballons (BJO-0930 from Union Carbide, 5-127 micrometers, density 0.25-0.35) | 15 |

A sample of this composition was evaluated as in the case of Examples 4A and 4B.

It was found that an integral solid film of reddish color had been formed through the 6th step. No deformation was observed.

EXAMPLE 9

A three-dimensional object was made from 20 successive layers of the composition described in Example 3C, by using the method of this invention. An argon ion laser at 350-360 nm wavelength was utilized as the radiation source. The diameter of the laser beam was 5 thousands of one inch. Each layer had a thickness of 5 thousandths of one inch.

What is claimed is:

1. A method for accurately fabricating an integral three dimensional object from successive layers of a photohardenable liquid composition comprising the steps of:
   (a) forming a layer of a photohardenable liquid;
   (b) photohardening at least a portion of the layer of photohardenable liquid by exposure to actinic radiation;
   (c) introducing a new layer of photohardenable liquid onto the layer previously exposed to actinic radiation; and
   (d) photohardening at least a portion of the new liquid layer by exposure to actinic radiation, with the requirement that the photohardenable composition comprises an ethylenically unsaturated monomer, photoinitiator, and radiation deflecting matter comprising hollow spheres, the deflecting matter having a first index of refraction, the rest of the composition having a second index of refraction, the absolute value of the difference between the first index of refraction and the second index of refraction being different than zero; and
   (e) successively repeating steps (c) and (d) until the three dimensional object is complete.

2. The method of claim 1, wherein the absolute value of the difference between the first index of refraction and the second index of refraction is greater than 0.02.

3. The method of claim 2, wherein the actinic radiation is in the form of a beam.

4. The method of claim 3, wherein the beam is a laser beam.

5. The method of claim 1, wherein the hollow spheres are glass spheres containing a gas.

6. The method of claim 1, wherein the hollow spheres are ceramic spheres containing a gas.

7. The method of claim 1, wherein the specific gravity of the radiation deflecting matter is within ±10% of the specific gravity of the rest of the composition.

8. A rigid solid object made with the method of claim 1.

* * * * *